(12) United States Patent
Tam

(10) Patent No.: US 6,937,052 B2
(45) Date of Patent: Aug. 30, 2005

(54) SENSING SERVICES AND SENSING CIRCUITS

(75) Inventor: Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/925,942

(22) Filed: Aug. 26, 2004

(65) Prior Publication Data

US 2005/0046438 A1 Mar. 3, 2005

(30) Foreign Application Priority Data

Sep. 3, 2003 (GB) .............................................. 0320642

(51) Int. Cl.[7] .............................................. G01R 31/02
(52) U.S. Cl. .................................. 324/765; 324/123 R
(58) Field of Search ................................ 324/522–523, 324/123 R, 124, 123 C, 765, 158.1; 327/52–54, 65–67, 72, 77, 89, 560–563; 330/252–255, 310–311; 365/66, 207–209

(56) References Cited

U.S. PATENT DOCUMENTS

| 5,519,348 A | | 5/1996 | Tanoi | |
|---|---|---|---|---|
| 5,568,438 A | * | 10/1996 | Penchuk | 365/208 |
| 5,642,078 A | * | 6/1997 | Navabi et al. | 330/253 |
| 5,929,659 A | | 7/1999 | Pantelakis et al. | |
| 6,069,522 A | * | 5/2000 | Venkatraman et al. | 327/552 |
| 6,191,989 B1 | * | 2/2001 | Luk et al. | 365/207 |
| 6,194,962 B1 | * | 2/2001 | Chen | 330/9 |
| 6,356,121 B1 | * | 3/2002 | Garnier | 327/66 |
| 2002/0030515 A1 | | 3/2002 | Garnier | |

* cited by examiner

Primary Examiner—Minh N. Tang
(74) Attorney, Agent, or Firm—Oliff & Berridge, PLC

(57) ABSTRACT

A current sensing circuit includes a differential current input stage connected to a differential voltage output stage. The differential current input stage includes a reference current input from a current source and a sensor current input from a sensing device; a first voltage output corresponding to the reference current and a second voltage output corresponding to the sensor current; and a first switch for substantially equalizing the first and second voltage outputs when closed. The first and second voltage outputs are respective inputs to the differential voltage output stage, which then outputs a differential output voltage corresponding to the difference between the first and second voltage outputs.

23 Claims, 12 Drawing Sheets

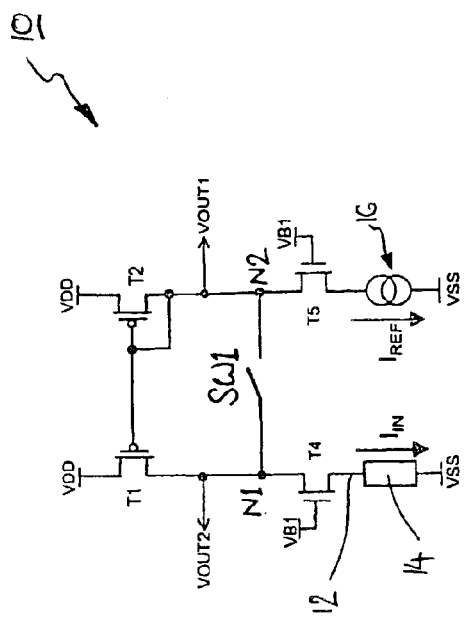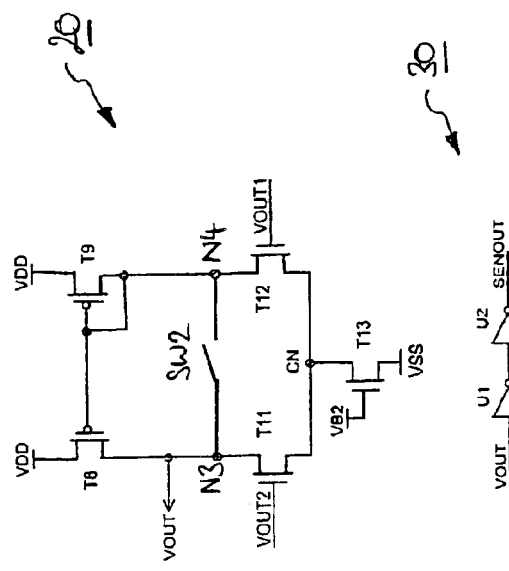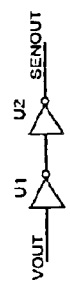
Figure 5 (a)
Figure 5 (b)
Figure 5 (c)

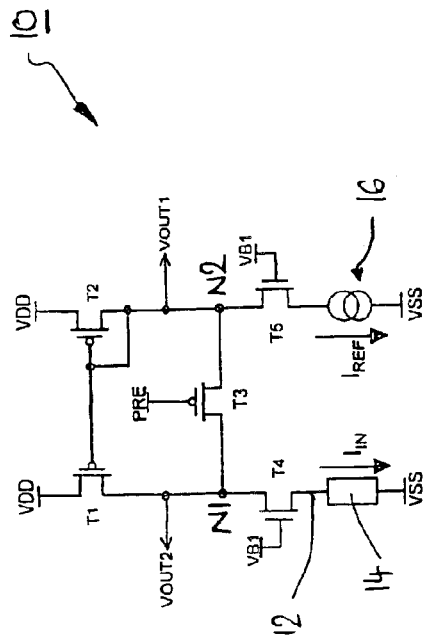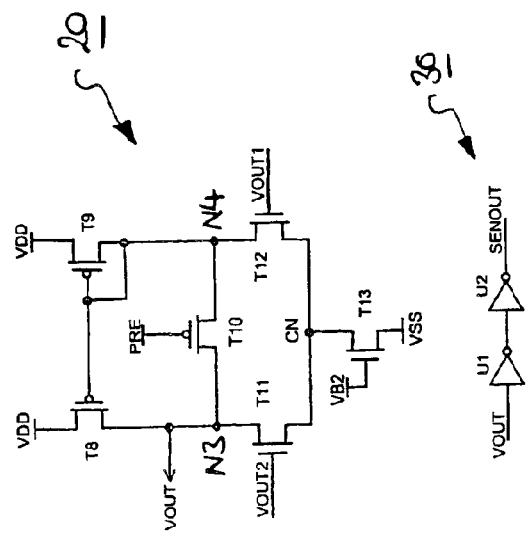
Figure 6 (a)
Figure 6 (b)
Figure 6 (c)

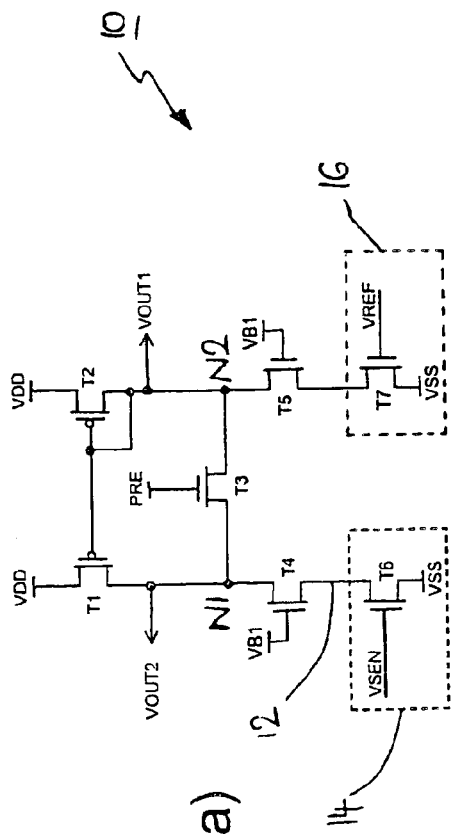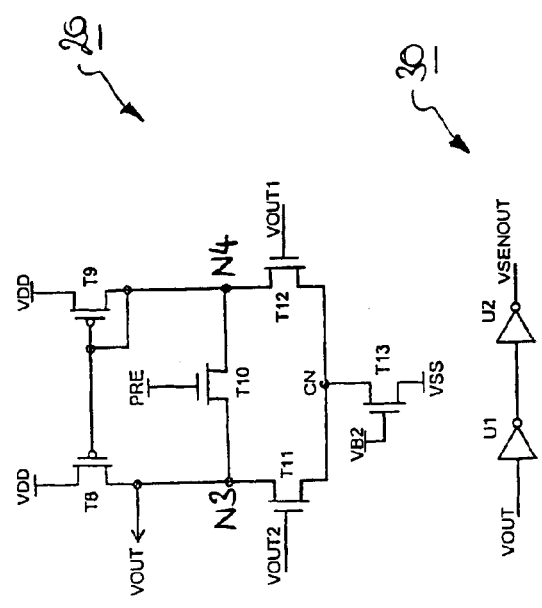
Figure 10 (a)
Figure 10 (b)
Figure 10 (c)

US 6,937,052 B2

SENSING SERVICES AND SENSING CIRCUITS

BACKGROUND

The present invention relates to sensing devices and sensing circuits, which may include such sensing devices. The present invention especially relates to current sensing circuits.

The resistance of many sensor devices changes in response to a specific event. Such resistance changes can be converted by a sensing circuit to changes in voltage or changes in current, which can then be measured to determine whether the event has occurred and, potentially, the scale of the event.

Thus, FIG. 1 shows a prior art sensing circuit 100 including a known sensing device 2. The sensing device 2 may be provided as an integrated circuit (IC), which can be connected into the sensing circuit 100. The sensing circuit 100 includes a constant current source $I_{IN}$ connected between earth and the positive input of a voltage comparator 1. One terminal of the sensing device 2 is connected between the current source $I_{IN}$ and the respective, positive input of the voltage comparator. The other terminal of the sensing device 2 is earthed. The negative input of the voltage comparator 1 is connected to a reference voltage source VREF.

Before the occurrence of an event, the sensing device 2 has a predetermined resistance and, consequently, the voltage applied to the positive input of the voltage comparator is consistently above (or below) $V_{REF}$. A corresponding signal $V_{OUT}$ (ON or OFF) is output by the voltage comparator 1. After the occurrence of an event, the resistance of the sensing device 2 is changed. This lowers (or raises) the voltage applied to the positive terminal of the voltage comparator 1 below (or above) $V_{REF}$. The signal that is output by the voltage comparator 1 is therefore switched to indicate the occurrence of the event. In other words, the voltage comparator 1 implements a discrimination function based on comparison of a voltage changed by the sensing device 2 and a reference voltage $V_{REF}$.

FIG. 2 also shows a prior art sensing circuit 200 including a known sensing device 2. However, in this case the positive input of the voltage comparator 1 is connected to the reference voltage $V_{REF}$. The negative input of the voltage comparator 1 is connected to the output of an operational amplifier 3, which has a negative feedback resistor R. The positive input of the operational amplifier 3 is earthed. A bias voltage source $V_{BIAS}$ is connected to the negative terminal of the operational amplifier 3, with the sensing device 2 connected in series between the bias voltage source $V_{BIAS}$ and the negative terminal.

Before the occurrence of an event, the sensing device 2 has a predetermined resistance and a corresponding current is supplied to the negative input of the operational amplifier 3. The operational amplifier 3 provides current to voltage conversion gain and a corresponding voltage is therefore applied to the negative terminal of the comparator. This corresponding voltage is consistently above (or below) the reference voltage $V_{REF}$ and a corresponding signal $V_{OUT}$ (OFF or ON) is output by the voltage comparator 1. After the occurrence of an event, the resistance of the sensing device 2 is changed. This lowers (or raises) the current supplied to the negative terminal of the operational amplifier 3. Hence, the voltage applied to the negative terminal of the voltage comparator 1 is lowered below (or raised above) $V_{REF}$. The signal $V_{OUT}$ output by the voltage comparator 1 is therefore switched to indicate the occurrence of the event. Again, the voltage comparator 1 implements a discrimination function. However, this discrimination is performed by converting the current of the sensor device 2 to a voltage and then comparing that voltage with a reference voltage $V_{REF}$.

It is often necessary to amplify the signal further for subsequent stages of electronics.

In the circuits of both FIGS. 1 and 2, the change in the resistance of the sensing device 2 is converted and compared with a constant threshold voltage signal $V_{REF}$ to discriminate the occurrence of an event. However, in practice the output of the sensing device is dependent not only on a specific parameter related to the event but also on other factors such as temperature and ageing. In addition, a tolerance exists in the characteristics of the sensing devices due to the fabrication process technology and/or variations in process conditions.

As shown in FIGS. 1 and 2, a differential voltage comparator 1 is commonly used to implement the discrimination function. A typical differential circuit for implementing the differential voltage comparator 1 is shown in FIG. 3. Specifically, the differential circuit includes a current mirror pair of transistors T101, T102, each connected to a first common rail $V_{DD}$. The gates of the current mirror pair of transistors are connected to each other, and the drain of one of the second current mirror transistors T101 is connected to its gate.

In addition, the differential circuit includes an input or differential pair of transistors T103, T104, each connected in series to a respective one of the current mirror gates of the input pair of transistors are connected to input voltages $V_{IN1}$ and $V_{IN2}$. Specifically, when used in the sensing circuit of FIG. 1, the gate of input transistor T104 would be connected to current source $I_{IN}$ and the gate of input transistor T103 would be connected to reference voltage $V_{REF}$. The voltages applied to the gates of the input transistors T103, T104 determine the current passed by the input transistors T103, T104.

The differential circuit further includes a current source transistor T105, connected in series between a second common rail $V_{SS}$ and a node, which is itself connected to both the input transistors T103, T104. The gate of the current source transistor T105 is biased to saturation so that a uniform, constant current is provided to both the matched input transistors T103, T104. However, the current that the input transistors pass is determined by the input voltages $V_{IN1}$ and $V_{IN2}$.

The output voltage $V_{OUT}$ of the differential circuit is the voltage at a node between the current mirror transistor T102 and the input transistor T104.

As shown in FIG. 4, an output amplification stage may be added to the differential circuit shown in FIG. 3. The output amplification stage includes transistors T106, T107 between the common rails $V_{DD}$ and $V_{SS}$, in series with each other and in parallel to the other transistors T101–T104. The voltage at the node between the current mirro transistor T102 and the input transistor T104 of the differential circuit is the input voltage to the gate of transistor T106 and the gate of transistor T107 is separately controlled. In this case, it becomes an operational amplifier as shown in FIG. 4.

SUMMARY

As noted above, prior art sensing circuits compare the output of a sensing device with a predetermined reference voltage $V_{REF}$. However, as discussed above, in practice the output of a sensing device is dependent not only on a specific parameter related to the event to be sensed but also on other factors such as temperature and ageing. In addition, a tolerance exists in the characteristics of the sensing devices due to the fabrication process technology and/or variations in process conditions. Consequently, the output of the sensing device does not always cross the threshold provided by the predetermined reference voltage $V_{REF}$ and events are not reliably sensed.

These difficulties are exacerbated when several sensing devices are provided, which can be sequentially connected into the sensing circuit. As the sensing devices age their outputs will vary from each other so that some sensing devices will correctly sense an event and others will not.

According to a first aspect of the present invention, there is provided a current sensing circuit including a differential current input stage connected to a differential voltage output stage.

The differential current input stage may include a reference current input from a current source and a sensor current input from a sensing device. It may further comprise a first voltage output corresponding to the reference current and a second voltage output corresponding to the sensor current; and still further a first switch for substantially equalising the first and second voltage outputs when closed.

The first and second voltage outputs from the differential current input stage may be respective inputs to the differential voltage output stage, which then outputs a differential output voltage corresponding to the difference between the first and second voltage outputs.

The differential voltage output stage may include a second switch for substantially eliminating the differential output voltage when closed.

The differential current input stage may include:
a first pair of current mirror transistors, each connected to a first common rail, the gates of the first pair of current mirror transistors being connected to each other, and a source or drain of one of the first pair of current mirror transistors being connected to its gate;
a pair of bias transistors, each connected in series to a respective one of the first pair of current mirror transistors, the gates of the pair of bias transistors being biased to saturation;
a first pair of nodes, each disposed between one of the pair of first current mirror transistors and a respective one of the pair of bias transistors; and
a first switch connected between the first pair of nodes;
wherein the current source is connected in series between a second common rail and a respective one of the pair of bias transistors; and
the sensing device is connected in series between the second common rail and the other of the pair of bias transistors.

The differential voltage output stage may include:
a second pair of current mirror transistors, each connected to the first common rail, the gates of the second pair of current mirror transistors being connected to each other, and a source or drain of one of the second pair of current mirror transistors being connected to its gate;
a pair of input transistors, each connected in series to a respective one of the second pair of current mirror transistors, the gates of the pair of input transistors being connected to respective ones of the first pair of nodes;
a second pair of nodes, each disposed between one of the second pair of current mirror transistors and a respective one of the pair of input transistors;
a second switch connected between the second pair of nodes; and
a current source transistor, connected in series between the second common rail and a further node, the further node being connected to both the input transistors, and the gate of the current source transistor being biased to saturation;
wherein the voltage of the node of the second pair of nodes that is connected to the other of the second pair of current mirror transistors is a differential output voltage.

The differential current input stage may include a first pair of current mirror transistors, a first switch between the sources or drains of the first pair of current mirror transistors, and a pair of bias transistors; and
the differential voltage output stage may include a second pair of current mirror transistors, a second switch between the sources or drains of the second pair of current mirror transistors, a pair of bias transistors the gates of which are connected to the outputs of the differential current input stage, and a differential tail current source.

In any case, the first pair of current mirror transistors may be matched, the pair of bias transistors may be matched, the second pair of current mirror transistors may be matched and the pair of input transistors may be matched.

In one embodiment, the switch or switches are arranged to be closed before sensing and to be open during sensing. The switch or switches may be N-type switches. In addition, the switch or switches and all the transistors may be polysilicon thin film transistors. Where provided, the first and second switches may be controlled using the same signal.

The current sensing circuit described above may include: a plurality of sensing devices; and selecting means for selecting which sensing device provides the sensor current input. The plurality of sensing devices may form an active matrix. In addition, where provided, the switch or switches may be arranged to be closed while the sensor current input is selected and to be open after the sensor current input is selected. Preferably, the current source and the sensing device are operated under the same conditions.

The current source may be adjustable. Also, the sensing device may include one or more capacitors.

The current sensing circuit described above may also include a further stage connected to the output of the differential voltage output stage for providing a digital output signal. The current sensing circuit may be formed as a single integrated circuit.

According to another aspect of the present invention, there is provided a fingerprint sensor including a current sensing circuit as described above.

According to another aspect of the present invention, there is provided an electronic memory including a current sensing circuit as described above.

According to another aspect of the present invention, there is provided a biosensor including a current sensing circuit as described above.

According to yet another aspect of the present invention, there is provided a method of sensing an event, the method including using a sensing device as described above.

According to another aspect of the present invention, there is provided a method of sensing an event including:
sensing a dummy sensor current;
sensing an active sensor current that changes in response to an event; and
comparing the dummy sensor current and the active sensor current to determine whether an event has occurred.

In this method, the step of comparing may include: converting the dummy sensor current and the active sensor current into a first voltage and a second voltage respectively; and obtaining a further voltage corresponding to the difference between the first voltage and the second voltage, said further voltage being indicative of the occurrence of an event.

The method may further include the step of converting said further voltage into a digital signal.

BRIEF DESCRIPTION OF THE DRAWINGS

Embodiments of the present invention will now be described by way of further example only and with reference to the accompanying drawings, in which:

FIG. 5 is a schematic representation of a sensing circuit according to the present invention;

FIG. 6 is a schematic representation of another sensing circuit according to the present invention;

FIG. 10 is a schematic representation of another sensing circuit according to the present invention;

DETAILED DESCRIPTION OF EMBODIMENTS

Figure 1:
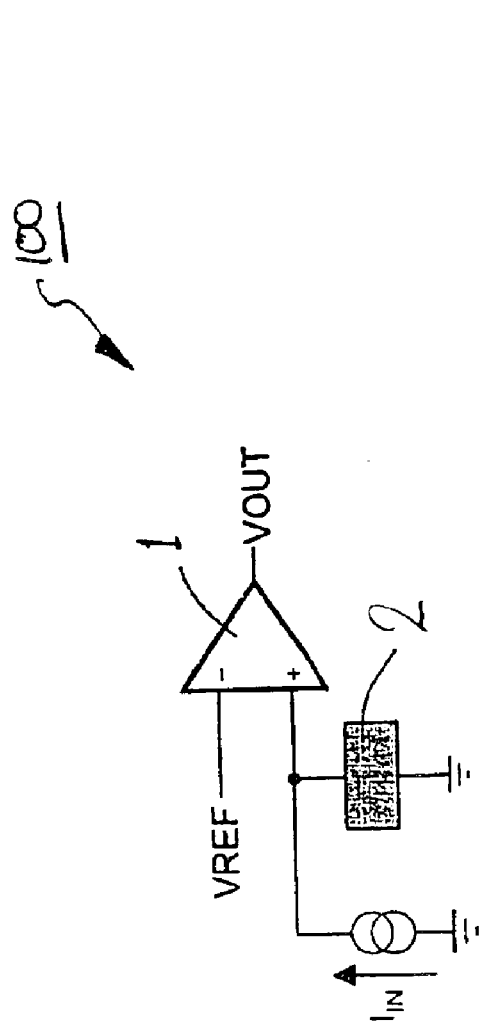
FIG. 1 illustrates a prior art sensing circuit.
Figure 2:
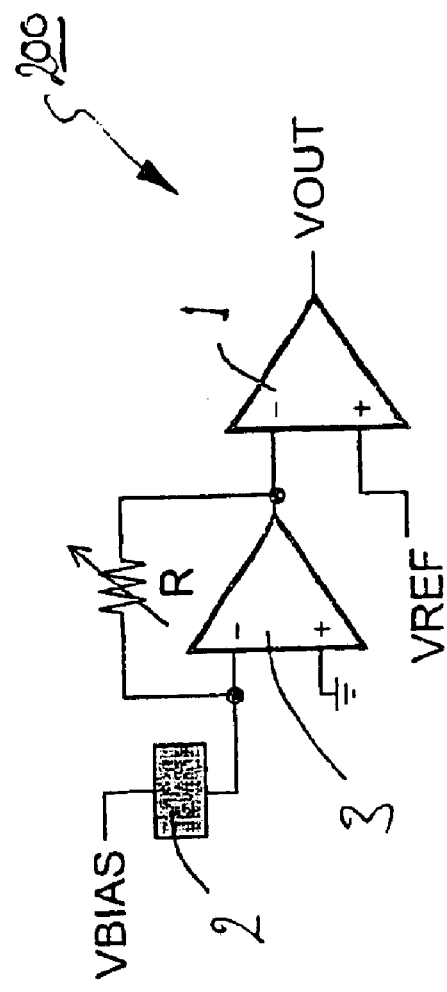
FIG. 2 illustrates another prior art sensing circuit.
Figure 4:
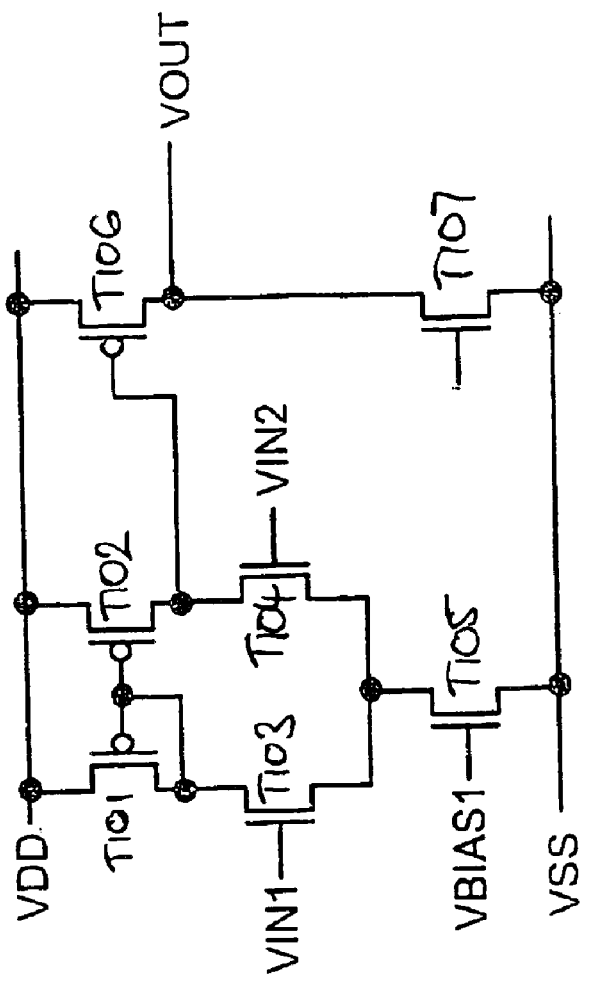
FIG. 4 illustrates a prior art operational amplifier.

In the present invention, all sensing circuits and sensing devices may be fabricated using thin film transistors formed using polycrystalline semiconductor material (for example, polysilicon TFTs) on the same insulating substrate. However, this invention can also be implemented using other technologies, in particular CMOS technologies. Moreover, a reference to a gate, source or drain of a transistor is intended throughout this application as a reference to a base, emitter and collector of a transistor, as appropriate, when the present invention is implemented using transistors to which these terms generally apply.

FIG. 5 illustrates one embodiment of a current sensing circuit according to the present invention. The circuit includes three parts, namely a differential current input stage 10 differential voltage output stage 20 and a buffer stage 30 shown in FIGS. 5(a), (b) and (c) respedtively.

FIG. 5(a) shows the differential current input stage 10. This stage compares a sensor current $I_{IN}$ from a sensing device 14, such as a transducer, with a reference current $I_{REF}$ from a current source 16. $V_{OUT1}$ and $V_{OUT2}$ are the output voltages.

More specifically, the differential current input stage 10 includes a first pair of matched transistors T1, T2 forming a current mirror, preferably a PMOS current mirror, as shown in FIG. 5(a). Each of these current mirror transistors T1, T2 is connected to a first common rail VDD. The gates of the current mirror pair of transistors are connected to each other, and the drain (preferably) of one of the current mirror transistors T2 is connected to the gate transistor T2.

The differential current input stage 10 also includes a matched, bias pair of transistors T4, T5. Preferably, the bias transistors T4, T5 are NMOS transistors. Each of the bias transistors T4, T5 is connected in series to a respective one of the first current mirror transistors T1 T2. The gates of the bias transistors T4, T5 are biased to saturation by bias voltage $V_{B1}$. A node is provided between each first current mirror transistor and the respective bias transistor to form a first pair of nodes N1, N2. A first switch SW1 is connected between the first pair of nodes N1, N2.

A current source 16 providing the reference current $I_{REF}$ is connected in series between a second common rail $V_{SS}$ and a respective one of the bias pair of transistors T5. The sensing device 14 providing the sensor current $I_{IN}$ is connected in series between the second common rail $V_{SS}$ and the other of the bias pair of transistors T4. However, in other embodiments a selecting means may be used to connect any one of a plurality of sensing devices between the second common rail VSS and the bias transistor T4 by means of a bit line 12.

The differential current input stage has two output voltages $V_{OUT1}$ and $V_{OUT2}$. The first output $V_{OUT1}$ corresponds to the value of the reference current $I_{REF}$ and is taken from the second node N2. The second output $V_{OUT2}$ corresponds to the value of the sensor current $I_{IN}$ and is taken from the first node N1.

The matching and biasing of input transistors T4 and T5 causes them to operate in saturation in order to minimise the effect of the input voltages of the current source 16 and the sensing device 14, which itself acts as a current source. Effectively, the bias transistors T4, T5 act as spacers between respective current sources 14, 16 and current mirror transistors T1, T2.

The switch SW1, which is connected between the two output voltages $V_{OUT1}$ and $V_{OUT2}$, controlled by a signal PRE. Before a sensing operation is carried out, switch SW1 is closet to equalise the output voltages, so $V_{OUT1}=V_{OUT2}$. At this moment, connection to the sensing device or transducer can be reconfigured, without affecting the output. Thus, where a plurality of sensing devices is provided, they can be individually selected to provide the sensor current input $I_{IN}$, without affecting the output of the current sensing circuit. Once SW1 is opened any current difference ($I_{IN}-I_{REF}$) is converted to a voltage difference ($V_{OUT1}-V_{OUT2}$).If there is no current difference (i.e. $I_{IN}=I_{REF}$), $V_{OUT1}=V_{OUT2}$ since T1 and T2 are matched.

FIG. 5(b) shows the differential voltage output stage 20. The differential voltage output stage 20 includes a pair of transistors T8, T9, which forms a second current mirror. Each of the second current mirror transistors T8, T9 is connected to a first common rail VDD. The current mirror is preferably a PMOS current mirror, as shown in FIG. 5(b). The gates of the second current mirror transistors are connected to each other, and the drain (preferably) of one of the second current mirror transistors T9 is connected to its gate.

In addition, the differential voltage output stage 20 includes a matched, differential or input pair of transistors T11, T12 each connected in series to a respective one of the current mirror transistors T8, T9. Preferably, the input transistors are NMOS transistors. The gates of the input transistors T11, T12 are connected to output voltages $V_{OUT1}$ and $V_{OUT2}$ of the differential current input stage 10.

The differential voltage output stage 20 further includes a current source transistor T13, connected in series between the second common rail $V_{SS}$ and a node CN, which is itself connected to both the input transistors T11, T12. The gate of the current source transistor T13 is biased by bias voltage $V_{B2}$ to saturation so that a uniform, constant current is provided to both the matched input transistors T11, T12. Thus, transistor T13 is biased in saturation and is used as a differential tail current source. However, the current that the input transistors T11, T12 pass is determined by the input voltages $V_{OUT1}$ and $V_{OUT2}$.

Figure 3:
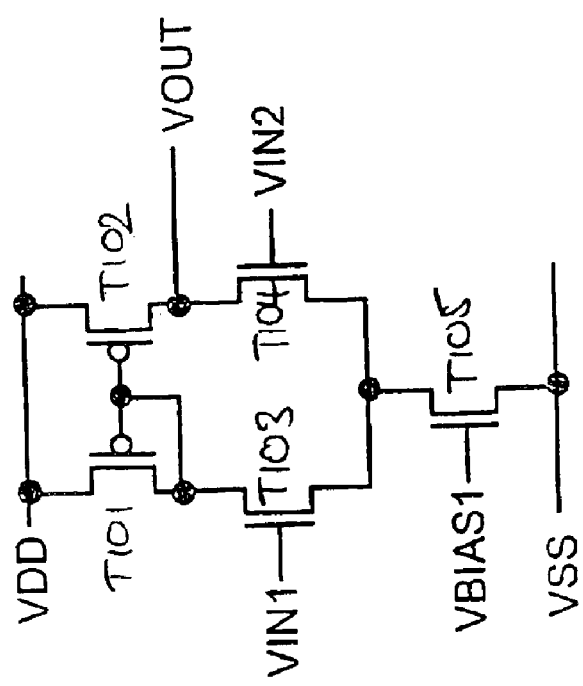
FIG. 3 illustrates a prior art differential circuit.

Thus, the differential current output stage 20 is similar to the prior art differential shown in FIG. 3. However, node is provided between each first current mirror transistor T8, T9 and the respective bias transistor T11, T12 to form a second pair of nodes N3, N4. A second switch SW2 is connected between the second pair of nodes N3, N4. Preferably, the second switch SW2 is connected between the drain terminals of NMOS current mirror transistors T8 and T9 and is controlled by the signal PRE.

The output voltage $V_{OUT}$ of the differential voltage output stage 20 is the voltage at the node N3 between the current mirror transistor T8 and the input transistor T11.

Initially, switch SW2 is closed. Once switch SW2 is opened, the output voltage $V_{OUT}$ is an amplified version of ($V_{OUT1}-V_{OUT2}$) up to its dynamic range and is wide enough to be distinguished by the buffer stage as shown in FIG. 5(c). However, the dynamic range is not the rail-to-rail range ($V_{DD}-V_{SS}$)

Effectively, switches SW1 and SW2 provide an equalising function so that the set-up time of the sensing circuit is reduced.

FIG. 5(c) shows a buffer stage consisting of two inverters U1 and U2. The input is connected to the output voltage $V_{OUT}$ of the differential current output stage in FIG. 5(b). The function of the buffer stage 30 is to provide a clean digital signal $V_{SENOUT}$ corresponding to the analogue output signal $V_{OUT}$ from the differential voltage output stage 20. In particular, the buffer stage provides rail-to-rail output voltage $V_{SENOUT}$ of the sensing circuit and provides sufficient drive current to the subsequent stages.

FIGS. 6(a) and (b) show the implementation of the circuits illustrated in FIGS. 5(a) and (b) using PMOS transistors T3, T10 as the equalisation switches SW1 and SW2. FIG. 6 (c) is the same as FIG. 5(c) and will not be described further.

Accordingly, using semiconductor process technologies, the present invention provides a sensing circuit integrating one or more sensing devices and a reference current source. More specifically, the sensing device or devices and a reference current source form part of the integrated sensing circuit and can be formed on a monolithic chip. In addition, the reference current source acts as a dummy sensing device. Thus, the current sensing circuit of the present invention is a differential current detection circuit, which compares the output of an active sensing device with the output of a dummy sensing device. Since they are formed in an integrated circuit, both the active and dummy sensing devices operate under the same conditions except for the parameters related to the specific event the sensing circuit is designed to sense. To achieve this, the present invention uses an input stage, in particular a differential current input stage 10, to sense and amplify the current difference between the active sensing device and the dummy sensing device and to interface with the subsequent differential voltage comparator.

The active sensing device and the dummy sensing device may be formed during the same process steps and are subject to the same operating conditions, such as temperature and ageing. In addition, they will have the same tolerances in transistor characteristics since they will be manufactured using the same fabrication process technology and/or the same variations in process conditions.

Effectively then, where a matrix of individually selectable active sensing devices is provided, the dummy sensing device 16 should have the transistor characteristics of an average active sensing device 14. To further improve the effectiveness of the sensing circuit, dummy switching could be provided between the dummy sensing device 16 and the remainder of the sensing circuit to mirror the switching for the active sensing devices 14 into and out of the sensing circuit. In addition, the threshold detection level $I_{REF}$ may also be adjustable. Preferably, the selection of a suitable threshold detection level should be performed automatically by the sensing circuit.

FIG. 7(a) shows how, in one embodiment, the sensor input current $I_{IN}$ can be supplied by the output transistor T6 of a sensing device 14 acting as a current source. Similarly, the reference current $I_{REF}$ can be supplied by the output transistor T7 of a dummy sensing device 16 acting as a reference current source. $V_{SEN}$ indicates the nodal voltage of the active sensing device 14, which supplies the sensor current $I_{IN}$. $V_{REF}$ indicates the nodal voltage of the dummy sensing device 16 of the same structure, which supplies the reference current $I_{REF}$. Thus, the dummy sensing device 16 includes an equivalent transistor T7, which is manufactured and used under the same conditions as the transistor T6 of the active sensing device 14. The link 12 between the sensing device may be a bit line, which can be implemented as a physically long line shared by many other similarly structured sensing devices. These active sensing devices 14 can be made inactive by setting $V_{SEN}=0V$. Similarly, the dummy sensing device 16 can be made inactive by setting $V_{REF}=0V$. FIGS. 7(b) and (c) are the same as FIGS. 6(b) and (c) and will not be described further.

Figure 7:
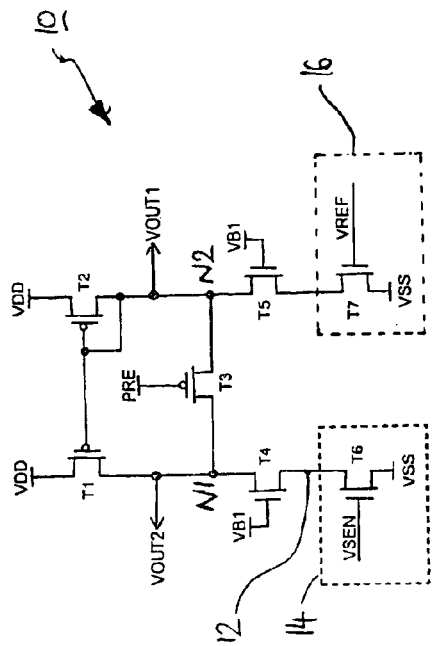
FIG. 7 is a schematic representation of another sensing circuit according to the present invention.
Figure 7:
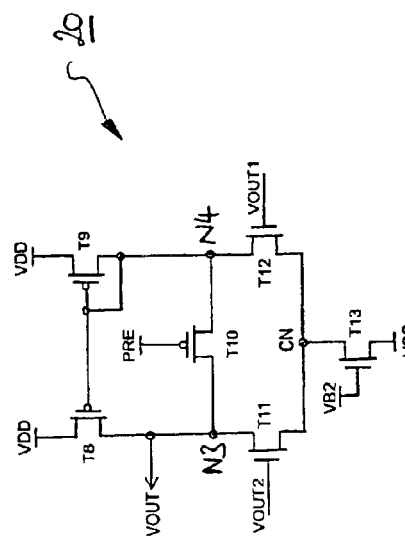
Figure 7:
Figure 8:
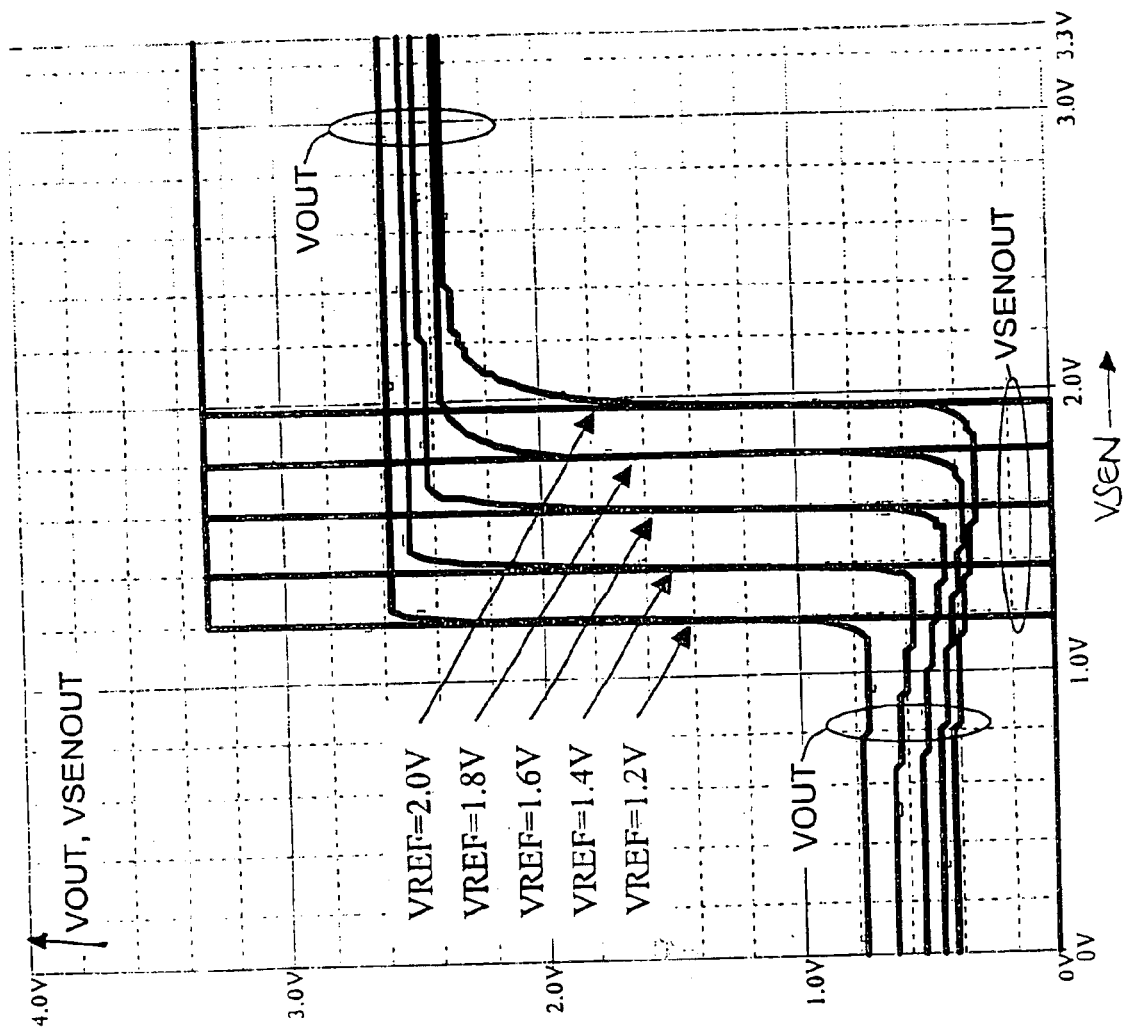
FIG. 8 illustrates the results of a DC simulation of the sensing circuit shown in FIG. 7 and shows various inputs and outputs of that sensing circuit.

FIG. 8 shows the DC transfer characteristics of the sensing circuit shown in FIG. 7. Specifically, FIG. 8 shows the DC transfer characteristics of $V_{OUT}$ from the differential voltage output stage 20 and $V_{SENOUT}$ from the buffer stage 30, for a range reference voltages $V_{REF}$, as the nodal voltage $V_{SEN}$ increases. As will be clear from the figure, the input threshold of the first inverter U1 in the buffer stage 30 is set between the lower horizontal line for $V_{OUT}$ on the left hand side of the figure (when no event is sensed) and the upper horizontal line for $V_{OUT}$ on the right hand side of the figure (when an event is sensed). Thus, the input threshold is set between approximately 1.0V and 2.0V in this embodiment.

Figure 9:
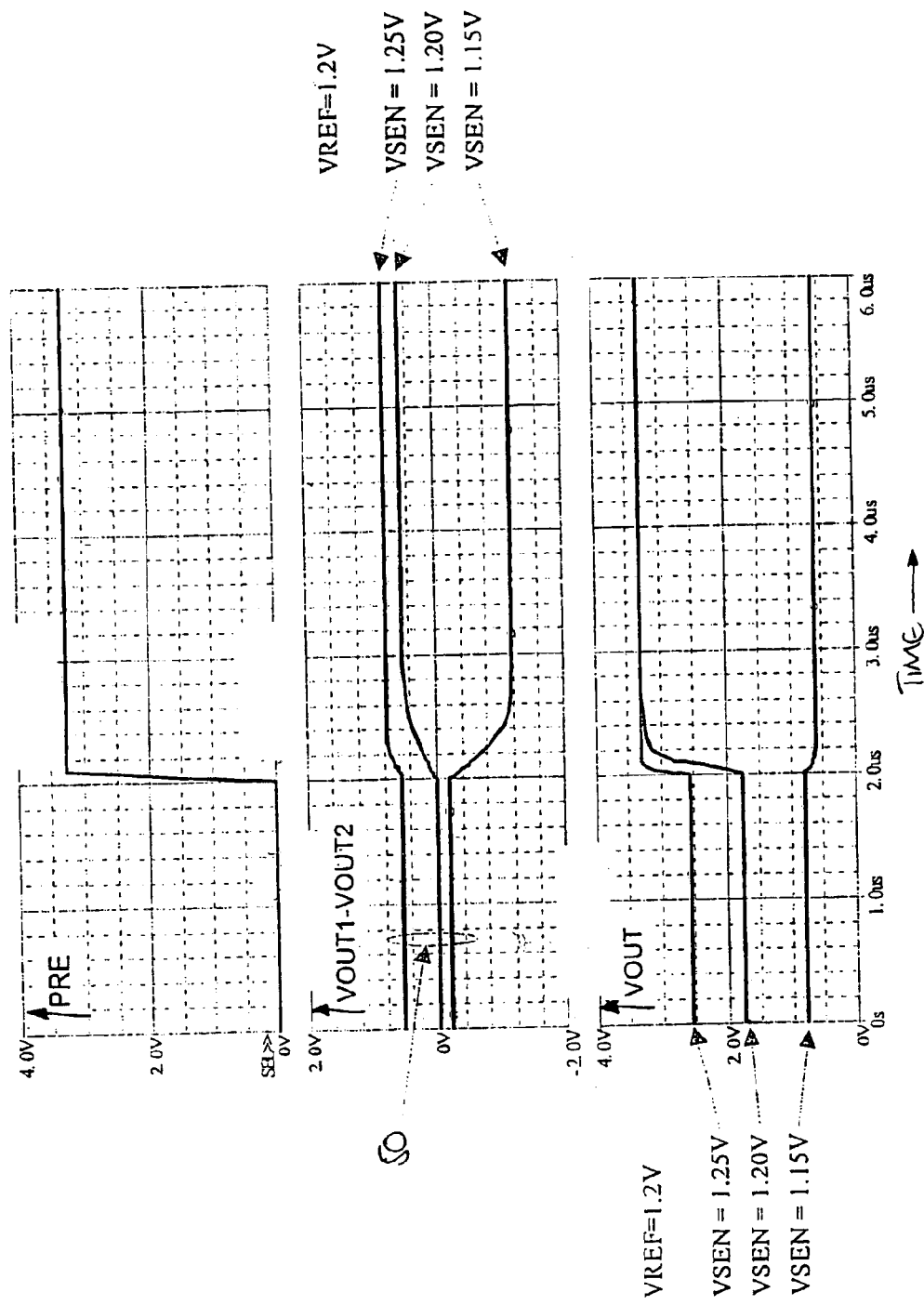
FIG. 9 also illustrates the results of a transient simulation of the sensing circuit shown in FIG. 7 and shows other inputs and outputs of that sensing circuit.

However, there is a disadvantage in using PMOS transistors T3, T10 for the precharge switches SW1 and SW2. FIG. 9 shows simulation results for the sensing circuit shown in FIG. 7 where $V_{REF}$ is set so $V_{REF}=1.2V$ and $V_{SEN}$ is set so $V_{SEN}=1.15V$, 1.20V and 1.25V respectively. Specifically, FIG. 9 shows how, for these parameters, the difference ($V_{OUT1}-V_{OUT2}$) between the outputs of the differential current input stage 10 and the output $V_{OUT}$ of the differential voltage output stage 20 vary as the precharge control signal PRE for the equalising transistors T3, T10 is varied.

In the initial period, the precharge control signal PRE is held low and the PMOS transistors T3, T10 are switched on.

Subsequently, the precharge control signal PRE is forced high and the PMOS transistors T3, T10 are switched off.

The results demonstrate that when $V_{REF}=V_{SEN}$ and SW1 and SW2 are closed in the initial period (time=0–2 μs), the output voltage difference $(V_{OUT1}-V_{OUT1})=0$. During the period when the equalising switches SW1, SW2 are closed, the output voltages $V_{OUT1}$ and $V_{OUT2}$ should also be equal regardless of the difference between $V_{SEN}$ and $V_{REF}$. However, the results of the simulation demonstrate that $(V_{OUT1}-V_{OUT2})\neq 0$ when $V_{REF}\neq V_{SEN}$. Moreover, the value of $(V_{OUT1}-V_{OUT2})$ changes as the difference between $V_{SEN}$ and $V_{REF}$ changes. This is potentially problematic. In particular, the sensing circuit could erroneously detect an event during the precharge phase, when the switches T3, T10 are closed.

In addition, the mobility of PMOS transistors is low and their resistance is correspondingly high. Thus, larger sized PMOS transistors are required for switches SW1, SW2 for the sensing circuit to operate effectively. However, a larger sized transistor contributes a larger feedthrough effect. This upsets the output voltage $V_{OUT}$ when the switches are turned off.

Figure 11:
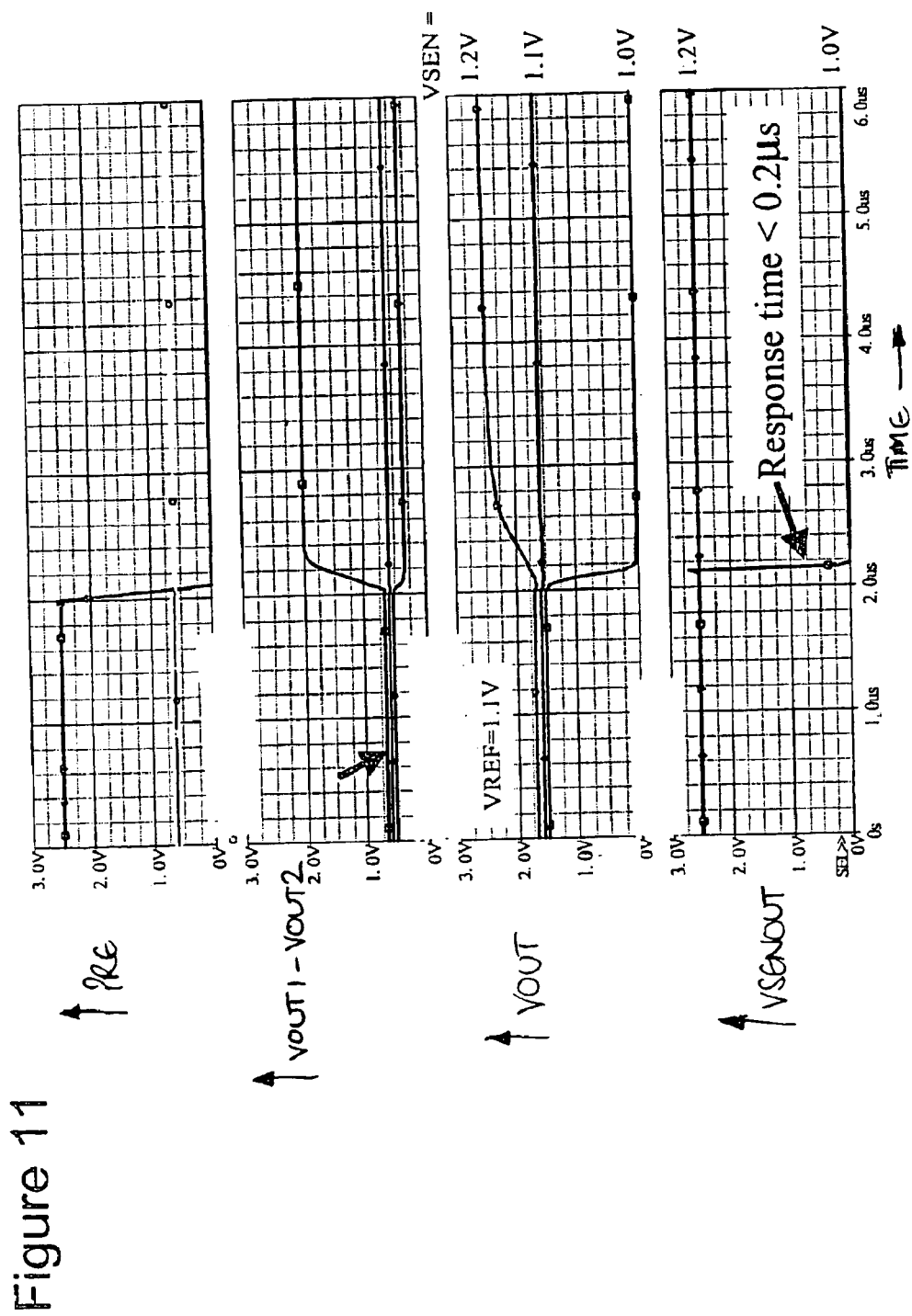
FIG. 11 illustrates the results of a transient simulation of the sensing circuit shown in FIG. 10 and shows various inputs and outputs of that sensing circuit.

To solve this problem, the switches SW1 and SW2 may be implemented using small NMOS transistors, which have higher mobility and lower on-resistance. This implementation is shown in FIG. 10. FIG. 11 shows simulation results for the sensing circuit illustrated in FIG. 10. Since the switches SW1, SW2 are implemented using NMOS transistors instead of PMOS transistors, the polarity of the precharge control signal PRE is reversed compared with FIG. 9. The simulation results illustrated in FIG. 11 show a good improvement. In particular, the values of $(V_{OUT1}-V_{OUT2})$ from the differential current input stage 10 and of $V_{OUT}$ from the differential voltage output stage 20 are substantially the same when the switches SW1, SW2 are closed, regardless of the difference between $V_{SEN}$ and $V_{REF}$. Thus, the threshold voltage of the first inverter U1 of the buffer stage 30 can be easily set so that events can be reliably and accurately detected, but only after the precharge phase when the switches SW1, SW2 have been opened. Moreover, the response time of the sensing circuit at $V_{SENOUT}$ is less than 0.2 μs for circuits implemented using polysilicon TFTs. Thus, each sensing device in a large active matrix array can be quickly and accurately switched into the sensing circuit for sensing.

Applications of the above-described sensing circuit are wide. They include, but are not limited to, fingerprint sensors, memory sense amplifiers and biosensors. These applications are described briefly described below.

Figure 12:
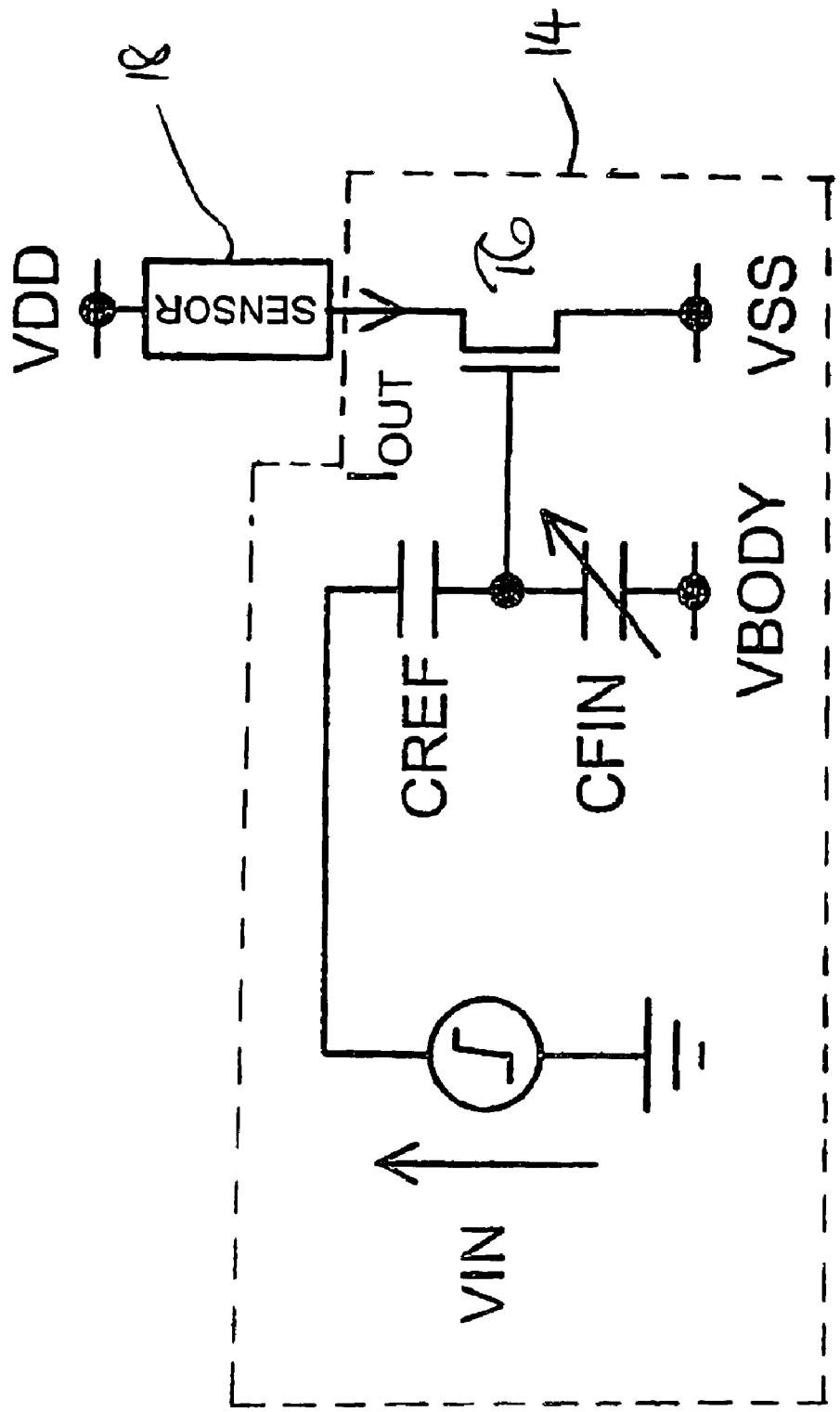
FIG. 12 shows a fingerprint sensor using a sensing circuit of the present invention.

FIG. 12 illustrates one embodiment of a fingerprint sensor. Here, the sensing device 14 corresponds with the sensing device 14 shown in FIG. 10(a). It includes a reference capacitance of a fixed value $C_{REF}$; the capacitance between a portion of a finger and a sensing pixel plate $C_{FIN}$; an applied excitation voltage $V_{IN}$; and an output transistor T6. The output transistor T6 of the sensing device 14 corresponds with the output transistor T6 of the sensing device 14 shown in FIG. 10(a). $V_{BODY}$ is the DC potential of a human body and $I_{OUT}$ is the output current of the sensing device 14. Accordingly, the output current $I_{OUT}$ of the sensing device 14 in FIG. 12 corresponds with input current $I_{IN}$ that is provided by the sensing device 14 in the differential current input stage 10 of FIG. 6(a). Thus, the sensor 18 of the fingerprint sensor in FIG. 12 corresponds with the portions of the sensing circuit in FIGS. 10(a), (b) and (c) other than the sensing device 14.

A dummy sensing device 16 of the sensor 18 is formed to have the same structure as the sensing device 14. A voltage is forced at the gate terminal of the equivalent transistor T7 of the dummy sensing device 16.

In practice, a large array of small sensing devices 14, each having a sensing pixel plate, is provided in a matrix. A finger is placed over the array of sensing plates and the sensing devices are sequentially switched into the sensing circuit. Equivalent dummy switching may be provided for the dummy sensing device 16. If a valley on the surface of the finger is placed over a particular sensing plate, then the capacitance between them will be comparatively low and no event is detected for that plate. In contrast, if a ridge on the surface of the finger is placed over a particular sensing plate, then the capacitance between them will be comparatively high and an event is detected for that plate. In this way, a map of ridges and valleys on the finger—in other words, an image of a fingerprint—can be determined.

The use in the present invention of an active matrix of sensing devices 14, which can be individually connected into the single sensing circuit, allows large space savings to be made. Consequently, the area within a sensing device for the reference capacitor $C_{REF}$ can be maximised, thereby further improving the accuracy of the device.

Figure 13:
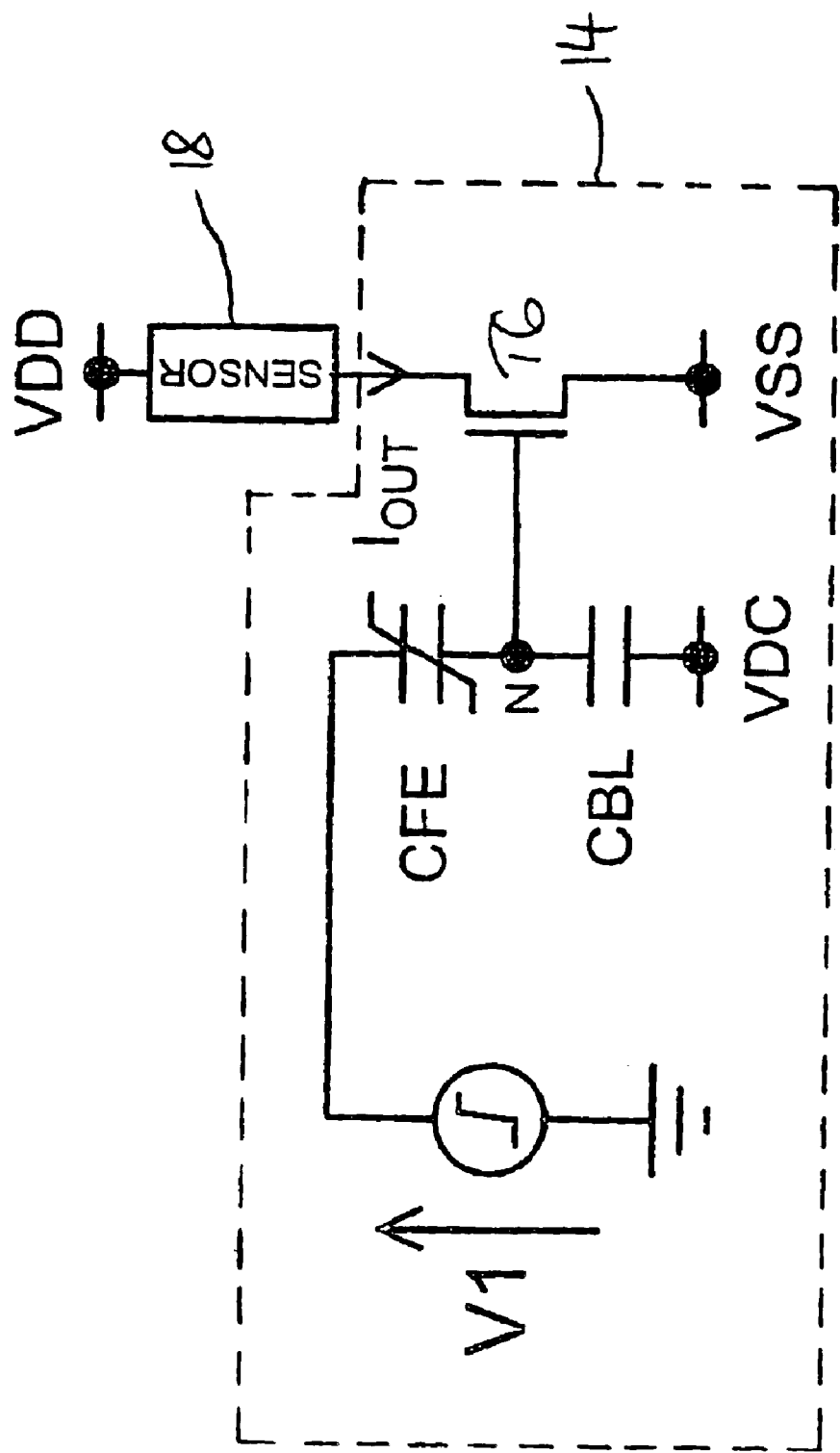
FIG. 13 shows a memory device using a sensing circuit of the present invention.

FIG. 13 shows a sensing circuit used for a memory application. Here, $C_{FE}$ in the sensing device 14 is a ferroelectric capacitor under interrogation. Capacitor $C_{BL}$ is the bit line capacitance and is biased to $V_{DC}$. Capacitors $C_{FE}$ and $C_{BL}$ are connected in series. The resultant nodal voltage at node N due to the excitation voltage V1 is fed to the gate of transistor T6, which translates it into a current for sensing by the current sensing circuit. Again, the output transistor T6 of the sensing device 14 shown in FIG. 13 corresponds with the output transistor T6 of the sensing device 14 shown in FIG. 10(a). Output current $I_{OUT}$ is the output current of the sensing device 14. Accordingly, the output current $I_{OUT}$ of the sensing device 14 in FIG. 13 corresponds with the input current $I_{IN}$ provided by the sensing device 14 in the differential current input stage 10 of FIG. 6(a). Thus, the sensor 18 of the memory application in FIG. 13 corresponds with the portions of the sensing circuit in FIGS. 10(a), (b) and (c) other than the sensing device 14.

A dummy sensing device 16 of the sensor 18 is formed to have the same structure as the sensing device 14. In particular, the dummy sensing device 16 is formed by providing a capacitor $C_{FE}$ with a known polarisation. The differential current input stage can function as the sense amplifier. Again, in practice a large array of sensing devices 14 is provided in a matrix and equivalent switching is provided for the dummy sensing device 16. This allows large space savings to be made and improves accuracy.

Figure 14:
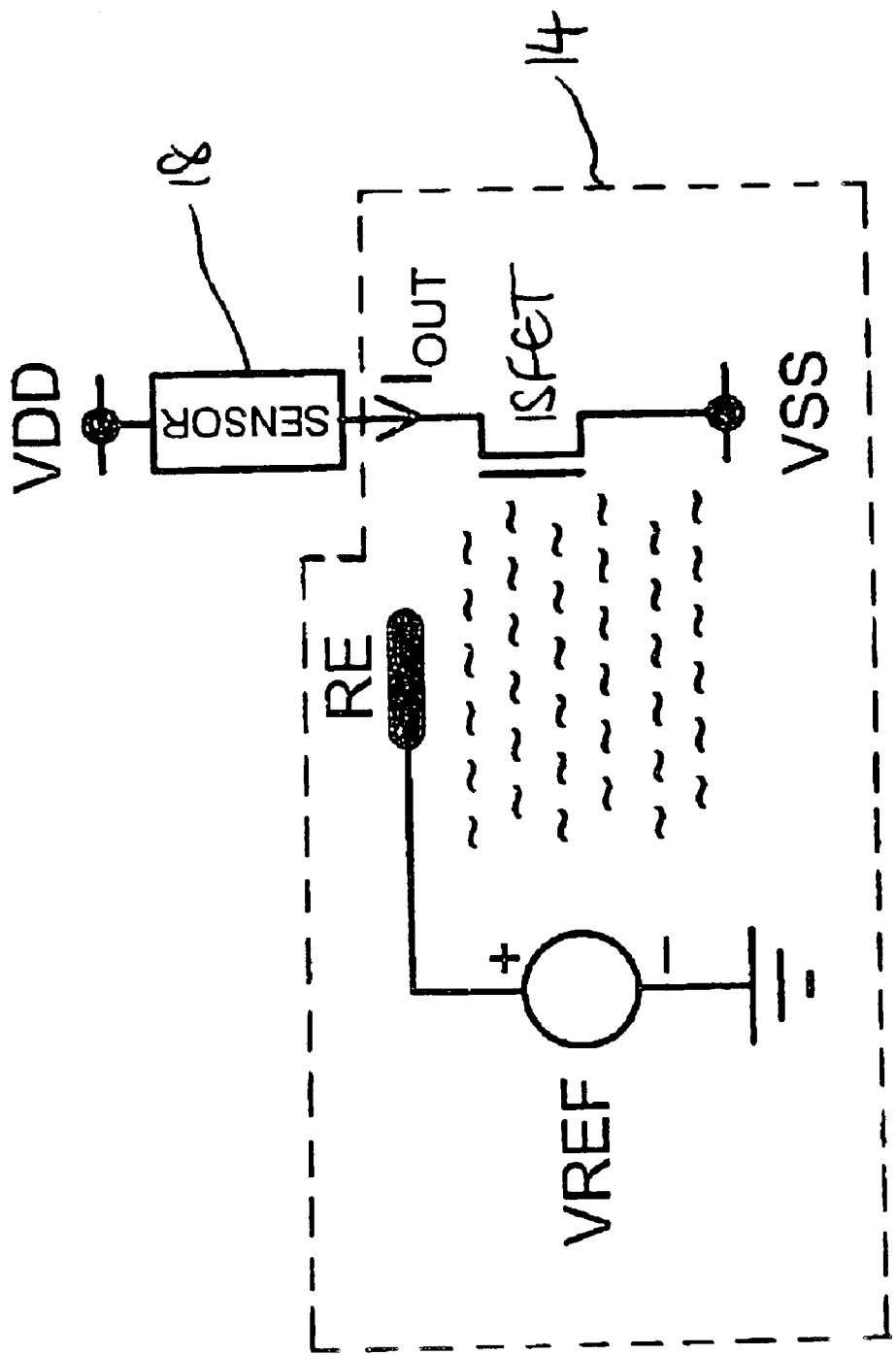
FIG. 14 shows a biosensor using a sensing circuit of the present invention.

FIG. 14 shows a sensing circuit used for a biosensor application. In the sensing device 14, $V_{REF}$ provides a potential by means of a terminal RE and through an electrolyte to a reference electrode. The reference electrode is an ion sensitive membrane and forms the gate of a field effect transistor (ISFET). Depending on the concentration of a specific ion in the electrolyte (e.g. pH), the ISFET outputs a current level $I_{OUT}$ to the sensor 18. Again, the ISFET of the sensing device 14 corresponds with the output transistor T6 of the sensing device 14 shown in FIG. 10(a). Accordingly, the output current $I_{OUT}$ of the sensing device 14 in FIG. 14 corresponds with the input current $I_{IN}$ provided by the sensing device 14 in the differential current input stage 10 of FIG. 6(a). Thus, the sensor 18 of the biosensor application in FIG. 14 corresponds with the portions of the sensing circuit in FIGS. 10(a), (b) and (c) other than the sensing device 14.

A sensing device 16 of the sensor 18 is formed to have the same structure as the sensing device 14. In particular, the dummy sensing device 16 is formed by coating an ISFET with a reference membrane. Again, in practice a large array of sensing devices 14 is commnonly provided in a matrix. This allows large space savings to be made and improves accuracy. Different electrolytes may be provided for different sensing devices. Alternatively, the same electrolyte may be provided for two, more than two or all the sensing devices, as a check.

In the aforegoing description, the term sensing device has been used to describe a single device, such as a transducer, a property of which changes in response to a specific event. In the described embodiments of the present invention, the sensing device outputs a current. In the art, each such a sensing device is commonly called a sensing cell and the active matrix of sensing cells is commonly called a sensing device. Thus, a sensing device including a plurality of sensing cells can be connected into the sensing circuit of the present invention.

Accordingly, the present invention provides a current sensing circuit, which compares a sensed current with a reference current. The reference current is generated under the same conditions as the sensed current and the detection of an event is therefore more accurately performed. Consequently, prior art difficulties in accurately selecting and setting a fixed reference voltage are overcome. Moreover, since the respective sources of the sensed current and the reference current are formed in the same IC, they are subject to the same process variations in fabrication and undergo the same degradation due to ageing and adverse environmental factors, such as temperature, humidity and pH.

The aforegoing description has been given by way of example only and it will be appreciated by a person skilled in the art that modifications can be made without departing from the scope of the present invention.

For example, it is not necessary to provide two switches SW1 and SW2. Moreover, if two switches are provided, they need not be controlled by the same signal, although this is preferable. In addition, it is not necessary that the differential current input and differential voltage output stages be implemented using the specific circuitry described. For example, they need not be implemented using polysilicon TFTs.

What is claimed is:

1. A current sensing circuit comprising a differential current input stage connected to a differential voltage output stage, the differential current input stage being adapted to receive a reference current input from a current source and a sensor current input from a sensing device and comprising:
   a first pair of current mirror transistors, each connected to a first common rail, the gates of the first pair of current mirror transistors being connected to each other, and a source or drain of one of the first pair of current mirror transistors being connected to a gate of said one of the first pair of current mirror transistors;
   a pair of bias transistors, each connected in series to a respective one of the first pair of current mirror transistors, the gates of the pair of bias transistors being biased to saturation;
   a first pair of nodes, each disposed between one of the pair of first current mirror transistors and a respective one of the pair of bias transistors; and
   a first switch connected between the first pair of nodes;
   the current source being connected in series between a second common rail and a respective one of the pair of bias transistors; and
   the sensing device being connected in series between the second common rail and the other of the pair of bias transistors.

2. A current sensing circuit according to claim 1, the differential voltage output stage comprising:
   a second pair of current mirror transistors, each connected to the first common rail, the gates of the second pair of current mirror transistors being connected to each other, and a source or drain of one of the second pair of current mirror transistors being connected to a gate of said one of the second pair of current mirror transistors;
   a pair of input transistors, each connected in series to a respective one of the second pair of current mirror transistors, the gates of the pair of input transistors being connected to respective ones of the first pair of nodes;
   a second pair of nodes, each disposed between one of the second pair of current mirror transistors and a respective one of the pair of input transistors;
   a second switch connected between the second pair of nodes; and
   a current source transistor, connected in series between the second common rail and a further node, the further node being connected to both the input transistors, and the gate of the current source transistor being biased to saturation;
   the voltage of the node of the second pair of nodes that is connected to the other of the second pair of current mirror being transistors a differential output voltage.

3. A current sensing circuit according to claim 2, the first pair of current mirror transistors being matched, the pair of bias transistors being matched, the second pair of current mirror transistors being matched and the pair of input transistors being matched.

4. A current sensing circuit comprising a differential current input stage connected to a differential voltage output stage, the differential current input stare being adapted to receive a reference current input from a current source and a sensor current input from a sensing device,
   the differential current input stage comprising a first pair of current mirror transistors, a first switch between the sources or drains of the first pair of current mirror transistors, and a pair of bias transistors; and
   the differential voltage output stage comprising a second pair of current mirror transistors, a second switch between the sources or drains of the second pair of current mirror transistors, a pair of bias transistors the gates of which are connected to the outputs of the differential current input stage, and a differential tail current source.

5. A sensing circuit, comprising:
   a first transistor;
   a second transistor; and
   a sensing device that changes a resistance corresponding to an event, the sensing device being disposed in series with the first transistor,
   a current mirror being formed by a first current path including the first transistor and the sensing device and a second current path including the second transistor.

6. The sensing circuit according to claim 5, further comprising a current source that is disposed in series with the second transistor and that is included in the second current path,
   a reference current flowing through the second current path, and
   a sensor current flowing through the first current path.

7. The sensing circuit according to claim 6,
a first voltage signal being outputted from the first current path,
a second voltage signal being outputted from the second current path, and
the sensing circuit detecting a voltage difference between a voltage level of the first voltage signal and a voltage level of the second voltage signal corresponding to a current difference between a current level of the sensor and a current level of the reference current.

8. The sensing circuit according to claim 6,
the current source being adjustable such that a current level of the reference current is varied.

9. The sensing circuit according to claim 7, further comprising:
a third transistor of which a gate receives the first voltage; and
a fourth transistor of which a gate receives the second voltage,
a current mirror being formed by a third current path including the third transistor and a fourth current path including the fourth transistor.

10. The sensing circuit according to claim 7, further comprising a first switch for controlling electrical connection between the first current path and the second current path,
the first switch being closed during a first period before the detection of the voltage difference is carried out, and
the first switch being opened during a second period in which the detection of the voltage difference is carried out.

11. The sensing circuit according to claim 9, further comprising a second switch that controls electrical connection between the third current path and the fourth current path.

12. The sensing circuit according to claim 9,
a third voltage signal being outputted from the third current path.

13. The sensing circuit according to claim 12,
a voltage level of the third voltage signal corresponding to the voltage difference.

14. The sensing circuit according to claim 9, further comprising:
a first switch that controls electrical connection between the first current path and the second current path; and
a second switch that controls electrical connection between the third current path and the fourth current path,
the first switch and the second switch being controlled by an identical signal.

15. The sensing circuit according to claim 9,
the first current path being connected between a first power supply voltage and a second power supply voltage,
the second current path being connected between the first power supply voltage and the second power supply voltage,
the third current path being connected between the first power supply voltage and the second power supply voltage, and
the fourth current path being connected between the first power supply voltage and the second power supply voltage.

16. The sensing circuit according to claim 5, further comprising a first switch that controls electrical connection between the first current path and the second current path.

17. The sensing circuit according to claim 5,
the first current path being connected between a first power supply voltage and a second power supply voltage, and
the second current path being connected between the first power supply voltage and the second power supply voltage.

18. A fingerprint sensor comprising the sensing circuit according to claim 5.

19. An electronic memory comprising the sensing circuit according to claim 5.

20. A biosensor comprising the sensing circuit according to claim 5.

21. The sensing circuit according to claim 5, further comprising:
a fifth transistor included in the first current path; and
a sixth transistor included in the second current path.

22. The sensing circuit according to claim 21,
each of fifth transistor and the sixth transistor being driven in a saturation state during a period in which a bias voltage is applied to gates of the fifth transistor and the sixth transistor.

23. The sensing circuit according to claim 22,
the first current path being connected between a first power supply voltage and a second power supply voltage, and
the second current path being connected between the first power supply voltage and the second power supply voltage, and
the sensing device being disposed between the fifth transistor and the second power supply voltage.

* * * * *

UNITED STATES PATENT AND TRADEMARK OFFICE
CERTIFICATE OF CORRECTION

PATENT NO. : 6,937,052 B2
DATED : August 30, 2005
INVENTOR(S) : Simon Tam

It is certified that error appears in the above-identified patent and that said Letters Patent is hereby corrected as shown below:

Title page,
Item [30], Foreign Application Priority Data, change
"Sep. 3, 2003 (GB)................................. 0320642" to
-- Sep. 3, 2003 (GB)................................. 0320642.2 --.

Signed and Sealed this

Sixth Day of December, 2005

JON W. DUDAS
*Director of the United States Patent and Trademark Office*